United States Patent [19]

Weigert

[11] Patent Number: 4,910,867
[45] Date of Patent: Mar. 27, 1990

[54] METHOD OF FORMING A SEALED ELECTRICAL CONNECTOR

[75] Inventor: Fidelo Weigert, Duerrwangen, Fed. Rep. of Germany

[73] Assignee: AMP Incorporated, Harrisburg, Pa.

[21] Appl. No.: 313,328

[22] Filed: Feb. 21, 1989

Related U.S. Application Data

[63] Continuation of Ser. No. 199,561, May 27, 1988, abandoned.

[51] Int. Cl.⁴ .............................................. H05K 3/34
[52] U.S. Cl. ........................................ 29/839; 29/883; 439/587; 439/588; 174/77 R; 427/96; 264/272.17
[58] Field of Search ................................ 29/883, 885; 264/272.11, 272.12, 272.13, 272.14, 272.17

[56] References Cited

U.S. PATENT DOCUMENTS

| | | | |
|---|---|---|---|
| 3,482,263 | 12/1969 | Ryder | 339/102 |
| 3,487,353 | 12/1969 | Massa | 339/89 |
| 3,668,299 | 6/1972 | McNeal | 264/272.17 |
| 3,772,637 | 11/1973 | Paullus et al. | 339/102 R |
| 3,784,952 | 1/1974 | Murray | 339/12 V |
| 3,816,641 | 6/1974 | Iversen | 174/76 |
| 3,914,003 | 10/1975 | Loy | 339/26 |
| 3,951,506 | 4/1976 | Bennett et al. | 339/104 |
| 4,083,902 | 4/1978 | Clyde | 174/76 |
| 4,179,319 | 12/1979 | Lofdahl | 174/77 |
| 4,335,932 | 6/1982 | Herrmann Jr. | 439/587 |
| 4,514,752 | 4/1985 | Engel et al. | 264/272.17 |
| 4,656,315 | 4/1987 | Rathmachers et al. | 194/74 R |
| 4,663,833 | 5/1987 | Tanaka et al. | 264/272.17 |
| 4,679,875 | 7/1987 | Ramsey | 439/604 |

FOREIGN PATENT DOCUMENTS 47901 1/1979 Fed. Rep. of Germany ........ 29/839

OTHER PUBLICATIONS

Adhesive and Sealant Compound Formulations, Second Edition, 1984.
Polymer Materials for Electronic Applications, Ace Symposium Series 184.
Polymers in Electronics, Ace Symposium Series 242.
Concise Encyclopedia of Chemical Technology.
Adhesives, Sealants, and Coatings for the Electronic Industry by Ernest W. Flick.
Catalog entitle, "Leaders in Micro-Precision Technology", (select pages).

Primary Examiner—P. W. Echols
Assistant Examiner—K. Jordan
Attorney, Agent, or Firm—Eric J. Groen

[57] ABSTRACT

An electrical connector having an insulating housing has a rear face with a plurality of electrical terminals extending therethrough. A sealant material in the form of a hotmelt material is placed over the ends of the terminals and the connector, including the sealing material, is thereafter heated to melt the material. The sealing material flows around the terminals and partially into the apertures of the housing to provide for a sealed atmosphere on the interior of the connector housing.

6 Claims, 3 Drawing Sheets

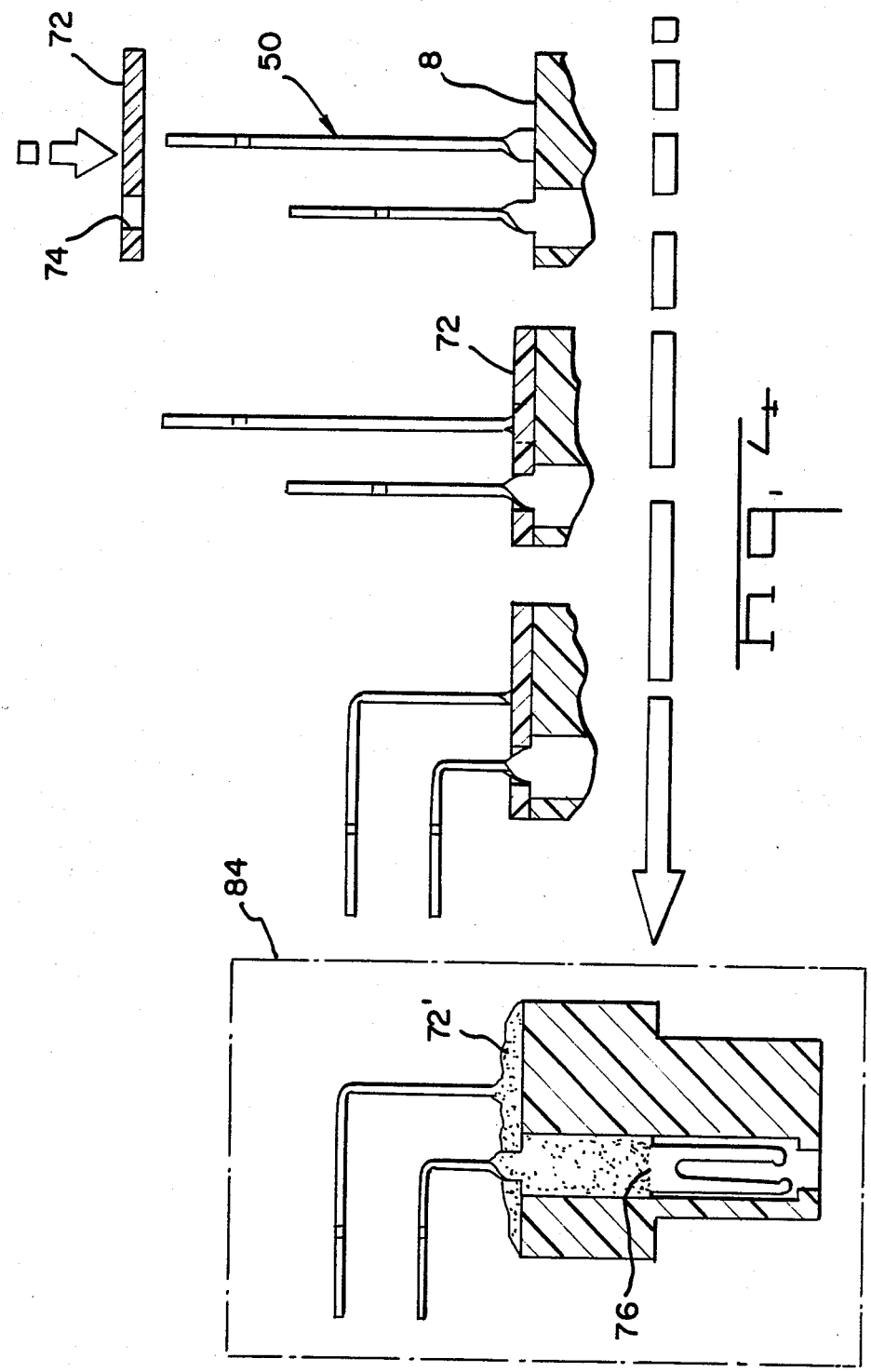

METHOD OF FORMING A SEALED ELECTRICAL CONNECTOR

This application is a continuation of application Ser. No. 07/199,561 filed May 27, 1988, now abandoned.

BACKGROUND OF THE INVENTION

1. Field of the Invention

The subject invention relates to the method of sealing electrical connectors, particularly those connectors which are used on printed circuit boards.

2. Description of the Prior Art

Electrical connectors are mounted to printed circuit boards for a variety of applications in the electronics industry, for such uses varying from modems for personal computers or for use as sockets for integrated circuit packages, for example the so-called "DIP sockets", and the like. After placing the connectors onto the boards, but prior to soldering of these connectors to the boards, the boards and the connector terminals undergo a cleaning process, where a cleansing fluid, typically referred to as flux, is passed over the connection area to prepare and treat the surfaces for soldering. A problem which results from this process is that, due to the natural surface tension of the flux material, the flux wicks up the terminals and can flow into the area where the electrical connection is made. This flux material can actually cause an electrical isolation between the terminals and the mating electrical component even when the two mating components are fully mated.

SUMMARY OF THE INVENTION

This problem has been eliminated by the inventive method disclosed herein and is summarily explained as: providing a sealant material for the electrical connector where the sealing material has a melting temperature which is less than that of the insulative housing of the electrical connector; placing the sealant material adjacent to a rear face of the connector with end portions of the terminals extending through the sealant material; heating the sealant material to the point where the sealant material melts and flows around the terminals; and cooling the sealant material to cure the sealant material.

In the preferred method, the heating step is undertaken in a convection oven. Furthermore, the heating step comprises the step of rotating the connectors within the oven to uniformly heat the sealant material.

In the preferred method, the heating step includes the heat transfer equivalent of an oven temperature of 180° C. for a duration of one minute.

In the preferred method, prior to placing the sealant material adjacent to the rear face, the sealant material is cut, or stamped to include apertures extending therethrough to match the terminal pattern.

In the preferred method, the sealant material is a hot melt material.

It should be noted that the inventive method is useful in all types of electrical connectors, although the invention will be described in detail with reference to a specific design shown in the drawing figures.

BRIEF DESCRIPTION OF THE DRAWINGS

FIG. 4 is a cross sectional view showing diagrammatically, the progression of the inventive method.

DETAILED DESCRIPTION OF THE PREFERRED EMBODIMENT

Figure 2:
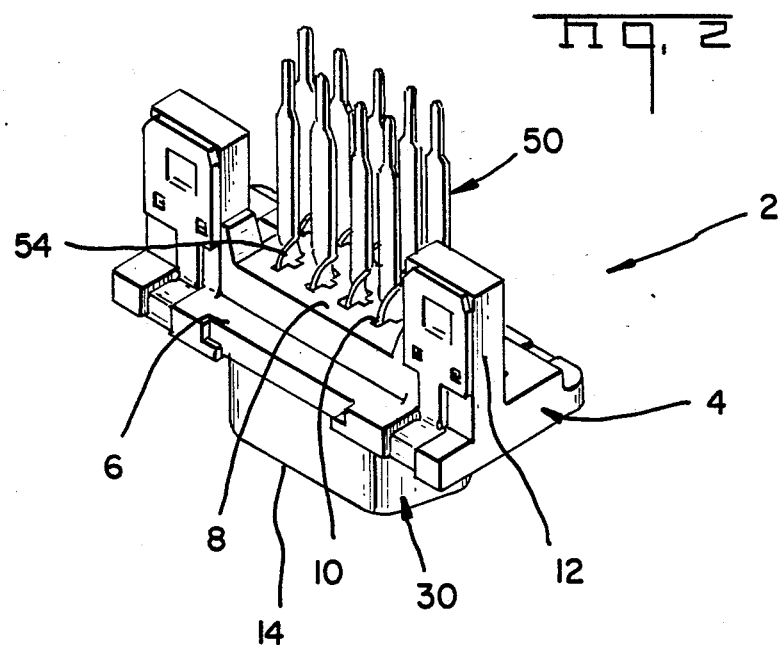
FIG. 2 is an isometric view showing the electrical connector prior to the placement of the sealant material adjacent to the rear face of the housing.
Figure 3:
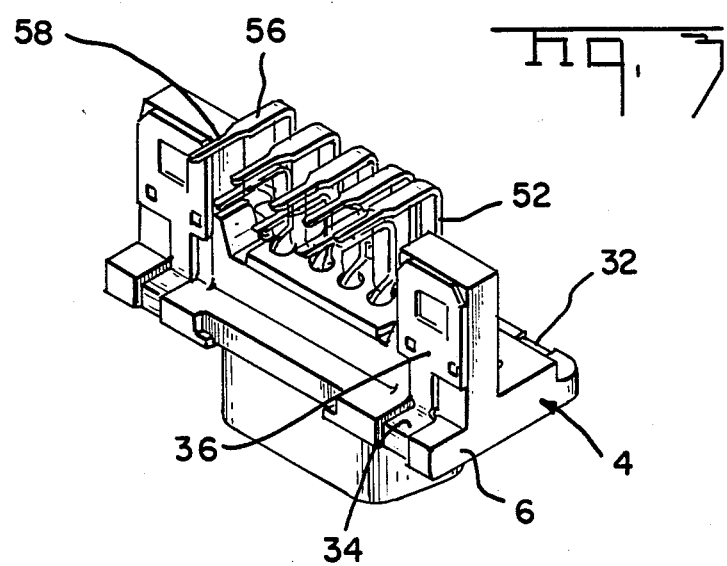
FIG. 3 is an isometric view showing the sealant material placed over the terminals, and placed adjacent to the rear face of the electrical connector.

FIG. 2 shows a typical electrical connector for use with the inventive method where the electrical connector 2 includes an insulative housing 4 including a plate portion 6 having a platform 12 extending perpendicularly therefrom, the platform being used for mounting on a printed circuit board. Above the platform 6 is a rear face 8 which includes a plurality of apertures such as 10 therein which extend through the rear face 8 to the front mating face 14. A plurality of electrical terminals are positioned within the apertures 10 and include contact portions adjacent to the front mating face 14. A shield, such as 30, is also included which includes tabs 32 and 34 to retain the shield member 30 to the platform 6 and further comprises feet 36 for an integral interconnection to ground traces on the printed circuit board. With the connector configured as shown in FIG. 2, the electrical connector can then receive the sealing material to form the sealed connector.

Figure 1:
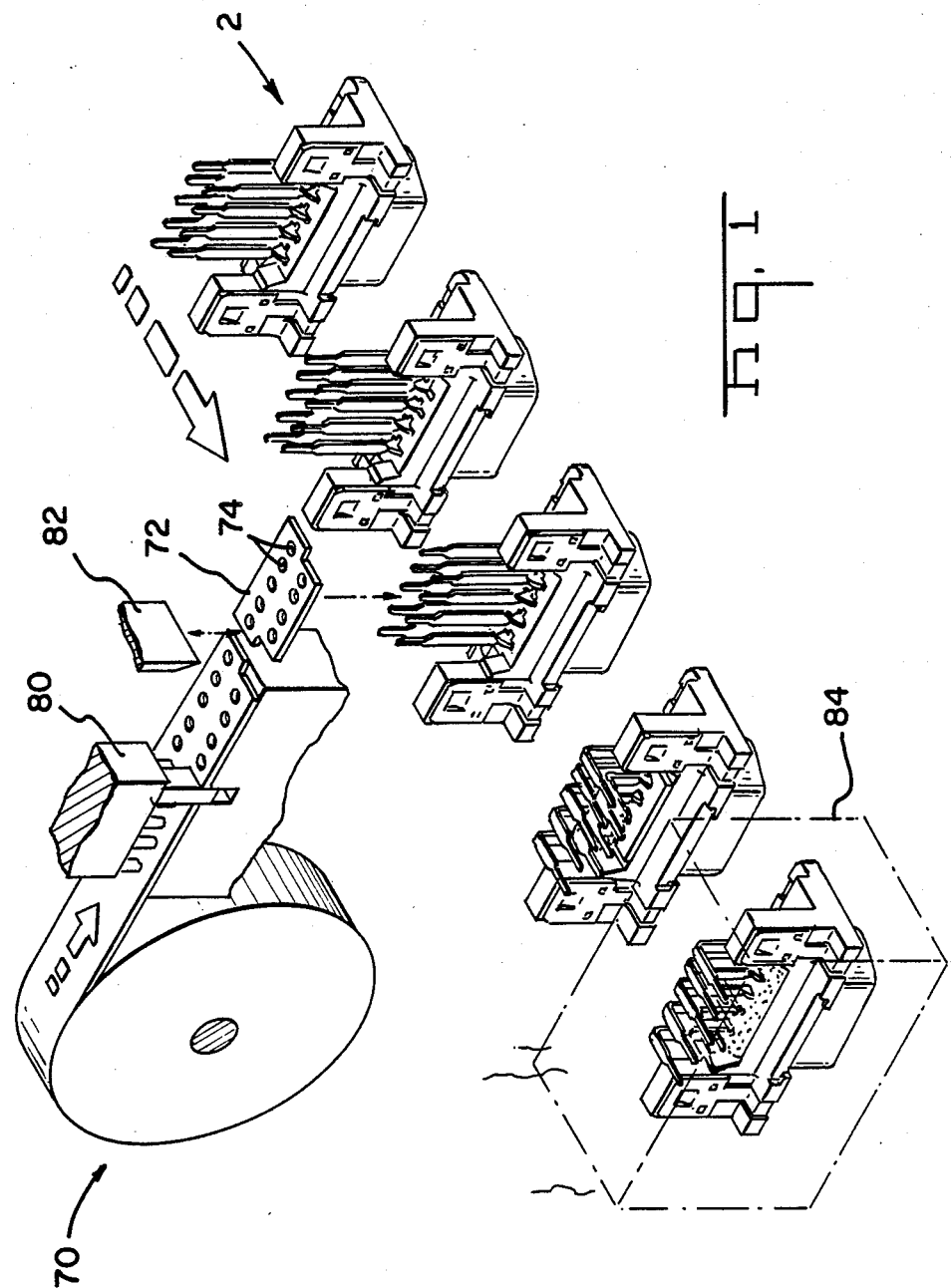
FIG. 1 is an isometric view showing a progression of the method.

As shown in FIG. 1, the electrical connector 2 can be preassembled to a position where the terminals 50 are inserted within, and the shield member 30 mounted to, the electrical connectors, although the terminals 50 of the legs 52 stand vertically to receive the sealing material. A roll of the sealing material, such as 70, can be moved in a direction transverse to the direction of the connectors and the sealing material can be stamped to conform to the rear face 8 of the electrical connector. In the preferred embodiment of the invention, a stamping die, such as 80, stamps a plurality of apertures 74 into the sealing material 70 while a knife, such as 82, shears the sealing material 70 into individual seal members 72. The individual sealing members 72 are then placed over the top of the upstanding terminal legs 52 and can be moved downwardly to lie adjacent to the rear face 8 of the electrical connector 2. The terminal legs 52 can then be formed into the desired right angle feature to include perpendicular sections 56 having printed circuit board tab portions 58.

The electrical connectors can then be moved to an oven where the sealing material is heated to a temperature which causes the material to melt and partially flow into the apertures 10 which extend beyond the rear face 8. Due to the natural surface tension of the flowing material, the molten material adheres to the exterior surfaces of the terminal portions 52 and to the interior portions of the apertures 10. It is important to note that the movement or flowing of the material 70 can be controlled by temperature and time duration such that the desired flow is achieved. For example, in the connector shown herein, the material is allowed to flow into the apertures 10 to form a face 76 of the material. The material is not allowed to flow further into the aperture 10, as this would cause the sealing material to flow into the contact area of the terminals. Advantageously, as the desired amount of flow of the molten material is achieved, the connectors are removed from the oven and the molten material quickly cures and solidifies, preventing further flowing of the material.

In the preferred embodiment of the invention, the material which is used as the sealing material is a hot melt material which is commercially available from the Chemische Fabrik G.m.b.H. and Company KG, Postfach 1134, D-7085 Bopfingen, West Germany; as type BS 610 material. Although this material is actually an adhesive which is used for binding books, or for such uses as gluing of fabrics in the furniture manufacturing industry, it has been found to be an excellent sealant material. Also in the preferred embodiment of the invention, the oven temperature is maintained at approximately 180° C. and the electrical connectors are placed in the oven for approximately one minute. Furthermore, in the preferred method, the oven includes a turntable which rotates the connectors to ensure uniform heating to the sealing material.

As shown above, the method is advantageously very easy to accomplish and can be easily incorporated into an existing manufacturing process. The desired material can be obtained in rolled or sheet form and can be automatically inserted over the terminal end portions, without a labor intensive process such as placing discrete seals and over the terminals. The connectors can also be automatically transferred into and out of the ovens.

I claim:

1. A method of making an electrical connector of the type comprising an insulating housing and a plurality of electrical terminals, the insulating housing having a rear face having a plurality of apertures extending therethrough for the receipt of the terminals, with end portions of the terminals extending beyond the rear face, the method comprising sealing the rear face of the connector by the steps of:
   providing a sealant material having a melting temperature which is less than that of the insulative housing;
   placing the sealant material adjacent to the rear face of the connector with the end portions of the terminals extending through the sealant material;
   subsequently heating the sealant material to the point where the sealant material melts and flows around the terminals; and
   cooling the sealant material to solidify the sealant material.

2. The method of claim 1 wherein the heating step is undertaken in a convection oven.

3. The method of claim 2 further comprising the step of rotating the connectors within the oven to uniformly heat the sealant material.

4. The method of either of claims 1 or 2 wherein the heating step includes the heat transfer equivalent of an oven temperature of 180° C. for a duration of one minute.

5. The method of claim 1 wherein, prior to placing sealant material adjacent to the rear face, the sealant material is formed to include apertures extending therethrough to match the terminal pattern.

6. The method of claim 1 wherein the sealant material is a hot melt material.

* * * * *